(12) United States Patent
Shida et al.

(10) Patent No.: US 9,185,771 B2
(45) Date of Patent: Nov. 10, 2015

(54) LIGHT EMITTING DEVICE AND ORGANIC EL ELEMENT DRIVING METHOD

(71) Applicant: NIPPON SEIKI CO., LTD., Niigata (JP)

(72) Inventors: Kuniaki Shida, Niigata (JP); Yukio Kimoto, Niigata (JP)

(73) Assignee: NIPPON SEIKI CO., LTD., Niigata (JP)

( * ) Notice: Subject to any disclaimer, the term of this patent is extended or adjusted under 35 U.S.C. 154(b) by 0 days.

(21) Appl. No.: 14/365,579

(22) PCT Filed: Nov. 9, 2012

(86) PCT No.: PCT/JP2012/079124
§ 371 (c)(1),
(2) Date: Jun. 13, 2014

(87) PCT Pub. No.: WO2013/088874
PCT Pub. Date: Jun. 20, 2013

(65) Prior Publication Data
US 2014/0346971 A1 Nov. 27, 2014

(30) Foreign Application Priority Data
Dec. 16, 2011 (JP) .................................. 2011-275335

(51) Int. Cl.
*G09G 3/10* (2006.01)
*H05B 33/08* (2006.01)
*G09G 3/34* (2006.01)

(52) U.S. Cl.
CPC ............ *H05B 33/0896* (2013.01); *G09G 3/342* (2013.01); *G09G 2330/02* (2013.01); *G09G 2330/028* (2013.01); *G09G 2330/08* (2013.01); *H01L 2251/568* (2013.01)

(58) Field of Classification Search
CPC ....................................................... G09G 3/32
USPC ......... 315/169.1–169.3; 345/204, 76, 214, 77
See application file for complete search history.

(56) References Cited

U.S. PATENT DOCUMENTS 6,734,636 B2 * 5/2004 Sanford et al. ............. 315/169.3
8,138,679 B2    3/2012 Konishi et al.
(Continued)

FOREIGN PATENT DOCUMENTS

JP     59-194393 A    11/1984
JP     2002-189448 A   7/2002
(Continued)

OTHER PUBLICATIONS

International Search Report issued in Appication No. PCT/JP2012/079124 dated Dec. 4, 2012.

*Primary Examiner* — Minh D A
(74) *Attorney, Agent, or Firm* — McDermott Will & Emery LLP

(57) ABSTRACT

Provided are a light emitting device and an organic EL element driving method wherein a light emission quality can be maintained by a self-repair without degrading the uniformity of light emission. A light emitting device is characterized in that the light emitting device comprises: a plurality of organic EL elements each of which is supplied with a current, thereby emitting a light; a constant current circuit that supplies a current to each of the organic EL elements; a reverse bias voltage circuit that applies a reverse bias voltage to each of the organic EL elements; and a switch circuit that connects the plurality of organic EL elements in series with the constant current circuit during light emission and that connects the plurality of organic EL elements in parallel with the reverse bias voltage circuit during application of the reverse bias voltage.

3 Claims, 8 Drawing Sheets

(56) References Cited

U.S. PATENT DOCUMENTS

2006/0022911 A1* 2/2006 Satoh et al. ............... 345/76
2010/0013746 A1* 1/2010 Seto ........................... 345/76
2010/0013825 A1* 1/2010 Takahashi et al. ......... 345/214

FOREIGN PATENT DOCUMENTS

| JP | 2003-282249 A | 10/2003 |
|----|---------------|---------|
| JP | 2005-91717 A  | 4/2005  |
| JP | 2009-238434 A | 10/2009 |

* cited by examiner

FIG2
(a)
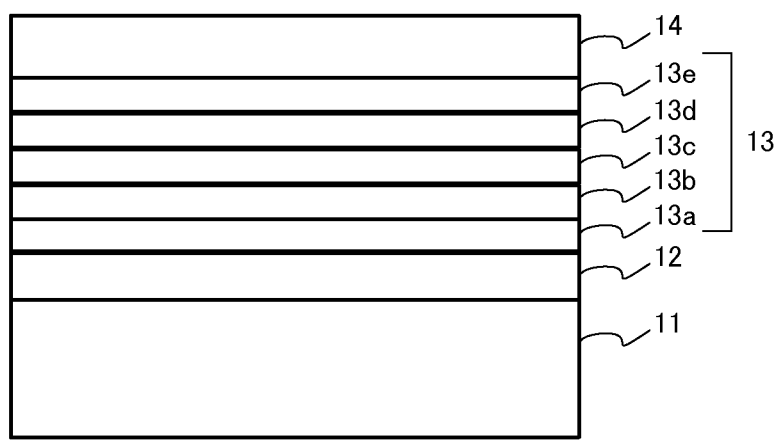
(b)
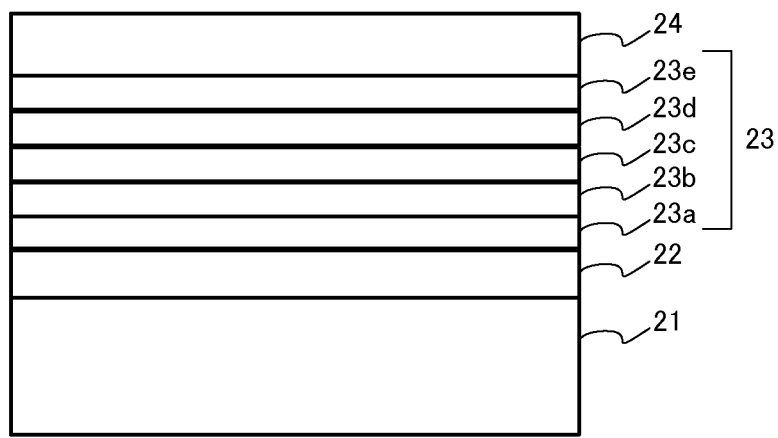

LIGHT EMITTING DEVICE AND ORGANIC EL ELEMENT DRIVING METHOD

CROSS-REFERENCE TO RELATED APPLICATIONS

The present application is the U.S. National Phase of PCT/JP2012/079124 dated Nov. 9, 2012 which claims priority from Japanese Patent Application No. 2011-275335 filed Dec. 16, 2011; the subject matter of each is incorporated herein by reference in entirety.

TECHNICAL FIELD

The present invention relates to a light emitting device using an organic electroluminescence (EL) element, and a method of driving an organic EL element.

BACKGROUND ART

An organic EL element known as a self-emitting element made of organic material is formed by sequentially laminating a first electrode made of indium tin oxide (ITO) or the like that becomes an anode, an organic layer having at least a light-emitting layer, and a second non-transmissive electrode made of aluminum (AL) or the like that becomes a cathode, for example (see Patent Literature 1).

Such an organic EL element emits light by injecting a positive hole from the first electrode, injecting an electron from the second electrode, and recombining the positive hole and electron in the light-emitting layer. An organic EL element has been adopted in a display, and recently a lighting device using an organic EL element as a light source has been developed.

CITATION LIST

Patent Literature

Patent Literature 1: Japanese Unexamined Patent Application Publication No. S59-194393
Patent Literature 2: Japanese Unexamined Patent Application Publication No. 2003-282249
Patent Literature 3: Japanese Unexamined Patent Application Publication No. 2005-91717
Patent Literature 4: Japanese Unexamined Patent Application Publication No. 2009-238434

SUMMARY OF THE INVENTION

Problems to be Solved by the Invention

It is known that light emission quality of an organic EL element is deteriorated by a non-emitting part generated by shorting electrodes due to a high leak part or a defect in a manufacturing process owing to a structure of laminating electrodes. There are methods of solving such a problem. One is an aging technique (see Patent Literature 2) that repairs without making a short circuit by previously eliminating (breaking) a part likely to occur a short circuit (hereinafter, referred to as a defective part) by applying a reverse voltage (hereinafter, referred to as a reverse bias voltage) before shipping a product. The other is a self-repair method (see Patent Literature 3) that provides a period for applying a reverse bias voltage during actual driving. Patent Literature 4 discloses a method of applying a reverse bias voltage to an organic EL element causing abnormality out of a plurality of organic EL elements.

In a kind of lighting device, light is emitted from a plurality of organic EL elements having an area larger than that used in a display. It is desirable to supply an emission current by connecting the plurality of organic EL elements in series for uniformly emitting light while suppressing variations in luminance of the organic EL elements.

However, when a reverse bias voltage is collectively applied in the same route as that for applying an emission current in such a configuration, there is a problem that when a reverse bias leak develops in an defective part due to an emission drive, an impedance of that organic EL element becomes lower than that of a normal organic EL element, the reverse bias voltage is divided in accordance with an impedance ratio of each organic EL element, a reverse bias voltage necessary for a repair is not applied to the organic EL having a defective part to be eliminated, and the organic EL element is not repaired causing a short circuit.

On the other hand, when a plurality of organic EL elements is connected in parallel, there is a problem that a reverse bias voltage is applied to each organic EL element, but it is necessary to separately set a current required to emit light during an emission drive, degrading the emission quality.

Further, when providing a route to apply an emission current separately from a route to apply a reverse voltage, it is necessary to pull out four wirings from each organic EL element, increasing the number of switches. This raises a problem that a space between the organic EL elements increases, and the wiring becomes complex.

The present invention has been made to solve the above problems. Accordingly, it is an object of the invention to provide a light emitting device and a method of driving an organic EL element capable of maintaining a light emission quality by a self-repair without degrading a light emission uniformity.

Means for Solving the Problem

In order to solve the above problems, a light emitting device of the present invention is characterized by comprising:

a plurality of organic EL elements each of which is supplied with a current, and emits light;

a constant current circuit that supplies a current to each of the organic EL elements;

a reverse bias voltage circuit that applies a reverse bias voltage to each of the organic EL elements, and a switch circuit that connects the plurality of organic EL elements in series with the constant current circuit during emission of light, and connects the plurality of organic EL elements in parallel with the reverse bias voltage circuit during application of reverse bias voltage.

The light emitting device is characterized in that a reverse bias voltage is applied to each of the organic EL elements at the same timing.

The light emitting device is characterized in that:

first and second organic EL elements are provided, and a cathode of the first organic EL element is connected with an anode of the second organic EL element, the switch circuit comprises a first switch that connects an anode of the first organic EL element to the constant current circuit or an earth potential, a second switch that switches connection and disconnection between a cathode of the first organic EL element and an anode of the second organic EL element, and a first potential of the reverse bias voltage circuit, and a third switch that connects a cathode of the second organic EL element to a second potential higher than the first potential of the reverse bias voltage circuit or the earth potential, the switch circuit connects the first switch to the constant current circuit, disconnects the second switch, and connects the third switch to the earth potential during emission of light, and the switch circuit connects the first switch to the earth potential, connects the second switch, and connects the third switch to the second potential during application of reverse bias voltage.

The light emitting device is characterized in that:

first to m-th organic EL elements are provided, and a cathode of n−1 st organic EL element is connectable with an anode of n-th organic EL element, the switch circuit comprises a first switch that connects an anode of the first organic EL element to the constant current circuit or an earth potential, a second switch that switches connection and disconnection between a cathode of the n−1st organic EL element and an anode of the n-th organic EL element, and the reverse bias voltage circuit, and a third switch that connects a cathode of the m-th organic EL element to the reverse bias voltage circuit or the earth potential, and a forth switch that connects an anode of the n-th organic EL element to a cathode of the n−1st organic EL element or the earth potential, the switch circuit connects the first switch to the constant current circuit, disconnects the second switch, connects the third switch to the earth potential, and connects the fourth switch to a cathode of the n−1st organic EL element during emission of light, and the switch circuit connects the first switch to the earth potential, connects the second switch to the reverse bias voltage circuit, connects the third switch to the reverse bias voltage circuit, and connects the fourth switch to the earth potential during application of reverse bias voltage.

In order to solve the above problems, the present invention provides a method of driving a plurality of organic EL elements each of which is supplied with a current, and emits light. The method is characterized in that the plurality of organic EL elements which is connected in series with a constant current circuit that supplies a current during emission of light, and the plurality of organic EL elements is connected in parallel with a reverse bias voltage circuit that applies a reverse bias voltage to each of the plurality of organic EL elements during application of reverse bias voltage.

The method is characterized in that a reverse bias voltage which is applied to each of the organic EL elements at the same timing.

Effect of the Invention

The present invention enables to maintain light emission quality by a self-repair without degrading uniformity of light emission.

BRIEF DESCRIPTION OF THE DRAWINGS

FIG. 2 is a schematic diagram showing an organic EL element used in the lighting device.

MODES FOR CARRYING OUT THE INVENTION

Hereinafter, an explanation will be given to an embodiment that the present invention is applied to a lighting device with reference to the accompanying drawings.

Figure 1:
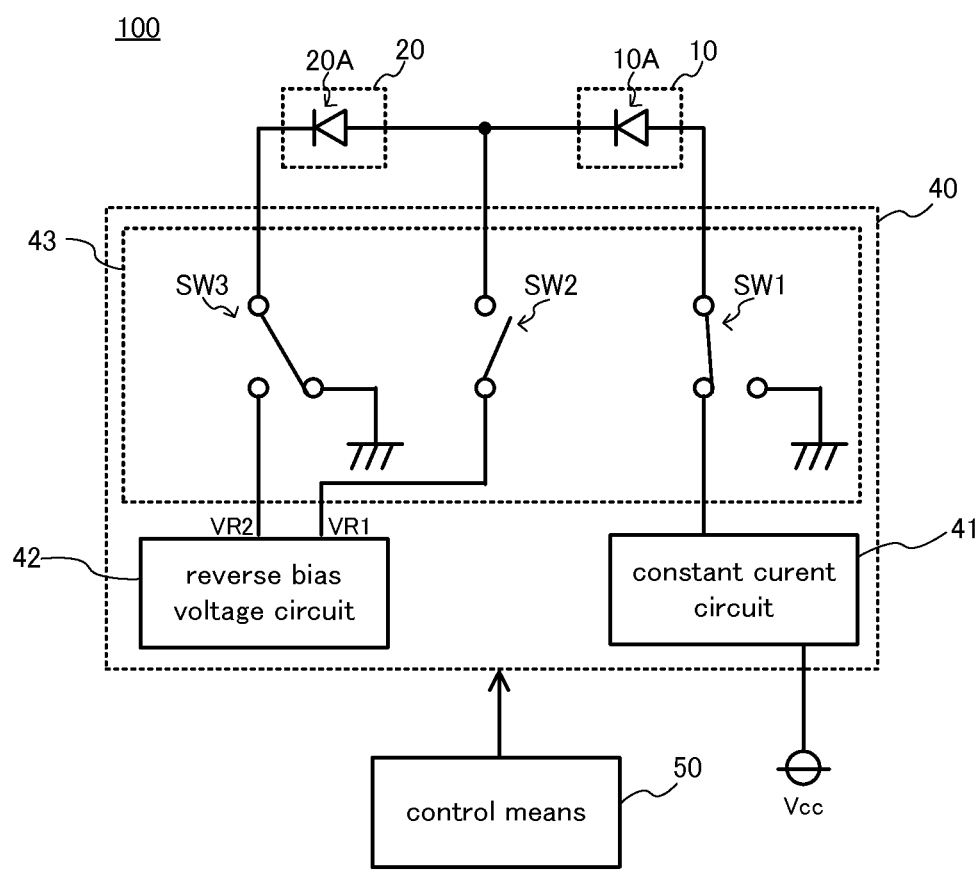
FIG. 1 is a diagram showing an electrical configuration of a lighting device according to a first embodiment of the present invention.

FIG. 1 is a diagram showing an electrical configuration of a lighting device 100 of a first embodiment of the present invention. The lighting device 100 of a first and second organic EL panels 10 and 20 that include first and second organic EL elements 10A and 20A described later, respectively, as a light-emitting part, and a drive circuit 40 that applies an emission current or a reverse bias voltage to the first and second organic EL panels 10 and 20. The lighting device 100 further comprises a control means 50 that controls the drive circuit 40.

FIG. 2($a$) is a diagram showing a first organic EL element 10A provided on the first organic EL panel 10. The first organic EL element 10A is formed by laminating a first electrode 12 that becomes an anode, an organic layer 13, and a second electrode 14 that becomes a cathode, on a support substrate 11. The first organic EL element 10A is formed by providing a sealing substrate that is coated with a moisture absorbent on the support substrate 11. The sealing substrate is omitted in FIG. 2.

The support substrate 11 is a rectangular substrate made of translucent alkali-free glass, for example. Other glass substrate made of alkali glass or the like may be used, and a glass thickness is not particularly restricted. On the support substrate 11, the first electrode 12, the organic layer 13, and the second electrode 14 are sequentially laminated.

The first electrode 12 is a part that becomes an anode for injection of positive holes, and is formed by laminating a transparent conductive material such as an ITO or AZO of 50 to 500 nm thickness on the support substrate 11 by a method of sputtering or vacuum evaporation, and is patterned into a predetermined shape by a method of photoetching or the like. The first electrode 12 is formed by subjected a surface treatment such as UV/03 surface treatment or plasma treatment. An area around the support substrate 11 including an edge of the first electrode 12 is covered by an insulating film (not shown) made of polyamide-based insulating material, defining a shape of a light-emitting part and preventing a short circuit.

The organic layer 13 consists of multiple layers including a light-emitting layer made of at least organic material, and is formed on the first electrode 12. In the embodiment, a positive hole injection layer 13$a$, a positive hole transport layer 13$b$, a first light-emitting layer 13$c$, a second light-emitting layer 13$d$, and an electron transport layer 13$e$ are sequentially laminated on the first electrode 12.

The positive hole injection layer 13$a$ has a function of taking in a positive hole from the first electrode 12, and is formed by laminating a positive hole transport organic material such as an amine compound of 20 to 120 nm thickness by a method of evaporation.

The positive hole transport layer 13b has a function of transmitting a positive hole to the first light-emitting layer 13c, and is formed by laminating a positive hole transport organic material such as an amine compounds of 20 to 40 nm thickness by a method of evaporation.

The first light-emitting layer 13c is a mixed layer of 20 to 60 nm thickness formed by mixing an electron-transporting first host material, an positive hole transporting material and a first light-emitting dopant that emits light by a method of co-evaporation or the like.

The first host material can transport a positive hole and electron, and has a function of lighting the first light-emitting dopant by recombining a positive hole and electron in a molecule. The electron-transporting host material mentioned here is an organic material with a relatively high electron-transporting ability, and in particular, a material with a high electron mobility μe and a low positive hole mobility μh. In particular, for example, an anthracene derivative is used. The positive hole-transport material is the same material as the positive hole-transport layer 13b, or may be a different material.

The first light-emitting dopant has a function of emitting light by reacting to recombination of positive hole and electron, and is made of an organic material that emits a predetermined emission color. In the embodiment, for example, a fluorescent material comprising a styrylamine that emits a blue-green color, and an amine substitution styrylamine compound is used in a doping amount not to cause concentration quenching.

The second light-emitting layer 13d is a mixed layer of 20 to 60 nm thickness formed by mixing an electron-transporting second host material, an positive hole transporting material and a second light-emitting dopant by a method of co-evaporation or the like.

The second host material can transport a positive hole and electron, and has a function of lighting the second light-emitting dopant by recombining a positive hole and electron in a molecule. The electron-transporting host material mentioned here is an organic material with a relatively high electron-transporting ability, and in particular, a material with a high electron mobility μe and a low positive hole mobility μh. In particular, for example, an anthracene derivative is used. The hole-transport material is the same material as the hole-transport layer 13b, or may be a different material.

The second light-emitting dopant has a function of emitting light by reacting to recombination of positive hole and electron, and is made of an organic material that emits a predetermined emission color different from the first light-emitting dopant. In the embodiment, for example, a fluorescent material comprising a fluoranthene skeleton or a pentacene skeleton that emits an orange color is used in a doping amount not to cause concentration quenching. The first and second light-emitting dopant may be phosphorescent material or heat delay fluorescent material other than a fluorescent material. The emission colors of the first light-emitting layer 13c and second light-emitting layer 13d may be reversed.

The electron transport layer 13e has a function of transmitting an electron to the second light-emitting layer 13d, and is a mixed layer of 20 to 60 nm thickness formed by mixing a triazine derivative and an alkali metal complex, for example, by a method of co-evaporation or the like.

The second electrode 14 becomes a cathode for injecting an electron, and consists of a conductive film of 20 to 300 nm thickness formed by laminating a low resistance conductive material such as aluminum (AL), magnesium (Mg), cobalt (Co), lithium (Li), gold (Au), copper (Cu), and zinc (Zn) on the electron transport layer 13e by a method of sputtering or vacuum evaporation.

As described above, the first organic EL element 10A is configured to emit light in a predetermined color (white in the embodiment) when a voltage is applied between the first electrode 12 and the second electrode 14. To simplify the description, the well-known contents of routing wiring and terminals for connection with the first electrode 12 or the second electrode 14 will be omitted as appropriate.

FIG. 2(b) shows a second organic EL element 20A provided on a second organic EL panel 20. The second organic EL element 20A is formed by laminating a first electrode 22 that becomes an anode, an organic layer 23, and a second electrode 24 that becomes a cathode, on a support substrate 21. The organic layer 23 is formed by sequentially laminating a positive hole injection layer 23a, a positive hole transport layer 23b, a first light-emitting layer 23c, a second light-emitting layer 23d, and an electron transport layer 23e, on the first electrode 22. Each part is the same as that of the first organic EL element 10A, and details thereof will be omitted.

A drive circuit 40 comprises a constant current circuit 41 that is connected to a power supply Vcc for supplying a constant current to the first and second organic EL element 10A and 20A, a reverse bias voltage circuit 42 that applies a reverse bias voltage to the first and second organic EL element 10A and 20A, and a switch circuit 43 that can switch a connection state for applying a constant current to the first and second organic EL elements 10A and 20A during emission of light, and a connection state for applying a reverse bias voltage to the first and second organic EL elements 10A and 20A during application of reverse bias voltage.

The switch circuit 43 comprises a first switch SW1 that is connected to the first electrode 12 of the first organic EL element 10A, and connects the first electrode 12 to the constant current circuit 41 or an earth potential (0V), a second switch SW2 that switches connection and disconnection between the second electrode 14 of the first organic EL element 10A and the first electrode 22 of the second organic EL element 20A, which are connected each other, and a first potential VR1 (10V) of the reverse bias voltage circuit 42, and a third switch SW3 that is connected with the second electrode 24 of the second organic EL element 20A, and connects the second electrode 24 to a second potential VR2 (20V) higher than the first potential VR1 of the reverse bias voltage circuit 42 or the earth potential (0V). The switch circuit 43 switches a connection state of the first to third switches SW1 to SW3 according to a control signal from a control means 50.

The control means 50 comprises mainly a microcomputer, outputs a control signal to the switch circuit 43 at predetermined intervals, thereby controlling emission of light of the first and second organic EL elements 10A and 20A.

The lighting device 100 comprises the components described above.

Next, an explanation will be given to a method of driving the first and second organic EL elements 10A and 20A in the lighting device 100.

(During Emission of Light)

Figure 3:
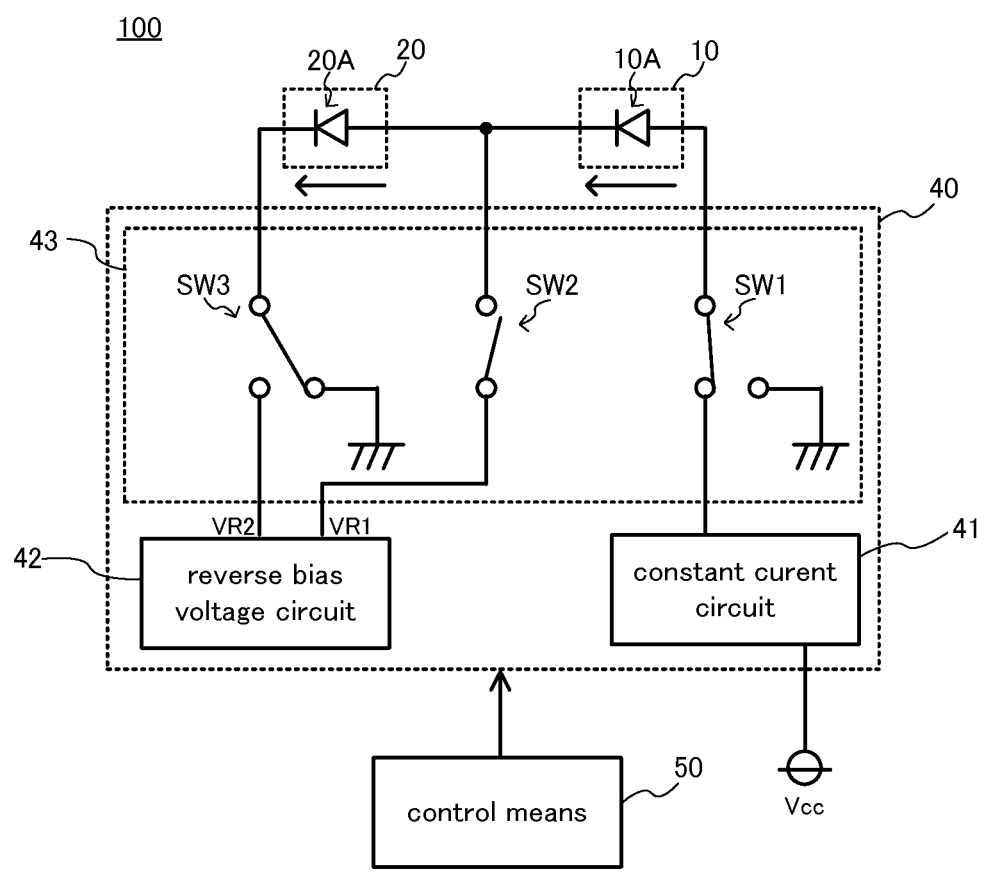
FIG. 3 is a diagram explaining a method of driving an organic EL element in the lighting device.

FIG. 3 shows a connection state of the switch circuit 43 during emission of light. During emission of light, the first switch SW1 is connected to the constant current circuit 41, the second switch SW2 is disconnected (opened), and the third switch SW3 is connected to an earth potential. In such a connection, a constant current from the constant current circuit 41 is applied to the first and second organic EL elements 10A and 20A in the forward direction as indicated by an arrow in the drawing, and the first and second organic EL elements 10A and 20A emit light. At this time, the first and second organic EL elements 10A and 20A are connected in series with the constant current circuit 41, and are applied with a constant current. The first and second organic EL elements 10A and 20A become the same brightness, and uneven brightness does not occur.

(During Application of a Reverse Bias Voltage)

Figure 4:
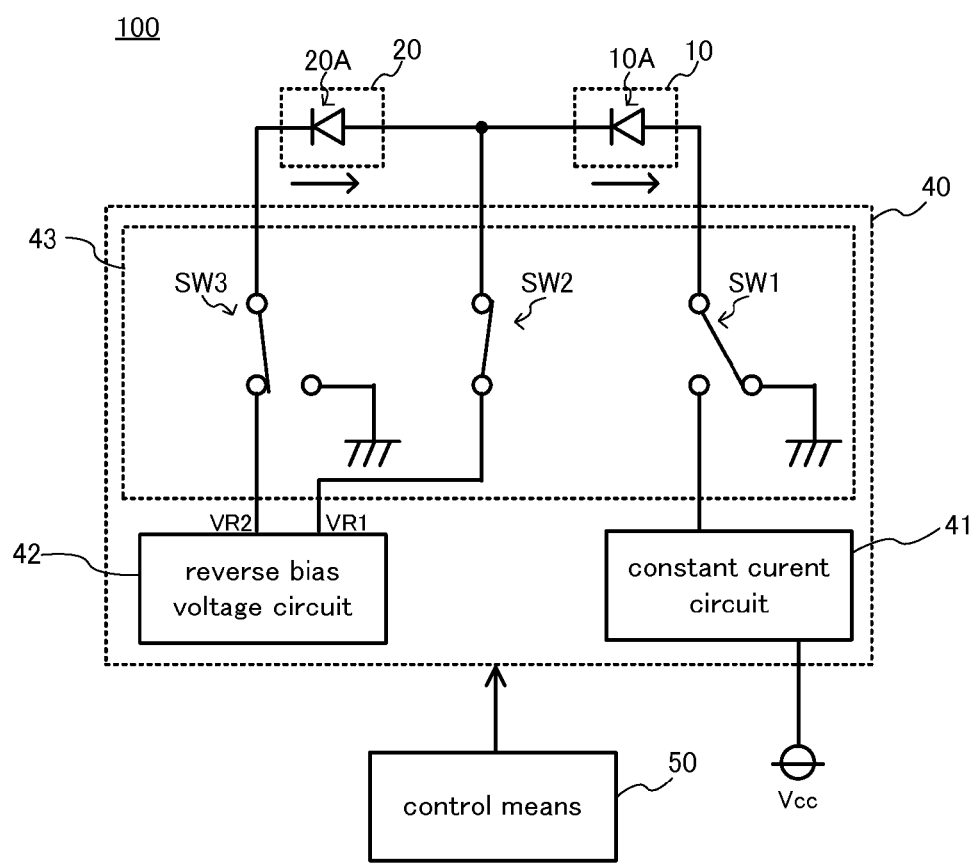
FIG. 4 is a diagram explaining a method of driving an organic EL element in the lighting device.

FIG. 4 shows a connection state of the switch circuit 43 during application of a reverse bias voltage. During application of a reverse bias voltage, the first switch SW1 is connected to an earth potential, the second switch SW is connected (shorted) to the first potential VR1 of the reverse bias voltage circuit 42 between the second electrode 14 of the first organic EL element 10A and the first electrode 22 of the second organic EL element 20A, and the third switch SW 3 is connected to the second potential VR2 of the reverse bias voltage circuit 42. In such a connection, a reverse voltage of −10V is applied between the first potential VR1 and the earth potential in the first organic EL element 10A, and a reverse voltage of −10V is applied between the second potential VR2 and the first potential VR1 in the second organic EL element 20A. The first and second organic EL elements 10A and 20A do not emit light. At this time, the first and second organic EL elements 10A and 20A are connected in parallel with the reverse bias voltage circuit 42, and are applied with a reverse bias voltage. Even when a reverse bias leak develops in a defective part of one organic EL element and impedance decreases, it is possible to apply a reverse bias voltage of a value necessary for repairing to each element. Further, since a reverse bias voltage is applied to the first and second organic EL elements 10A and 20A at the same timing, the first and second organic EL elements 10A and 20A do not alternately fail to emit light at a fixed time interval, and a user feels no discomfort due to a flicker.

As explained above, in the lighting device 100 and the method of driving the organic EL elements 10A and 20A, a constant current can be applied to the organic EL elements 10A and 20A connected in series during emission of light, and a reverse bias voltage can be applied to the organic EL elements 10A and 20A connected in parallel, thereby maintaining the light emission quality by a self-repair without degrading the light emission uniformity. Further, the number of wiring from the organic EL elements 10A and 20A is not increased, suppressing complexity of a circuit configuration.

Next, a second embodiment of the invention will be explained. The same or equivalent components as those of the first embodiment are denoted by the same reference numerals, and details thereof will be omitted.

Figure 5:
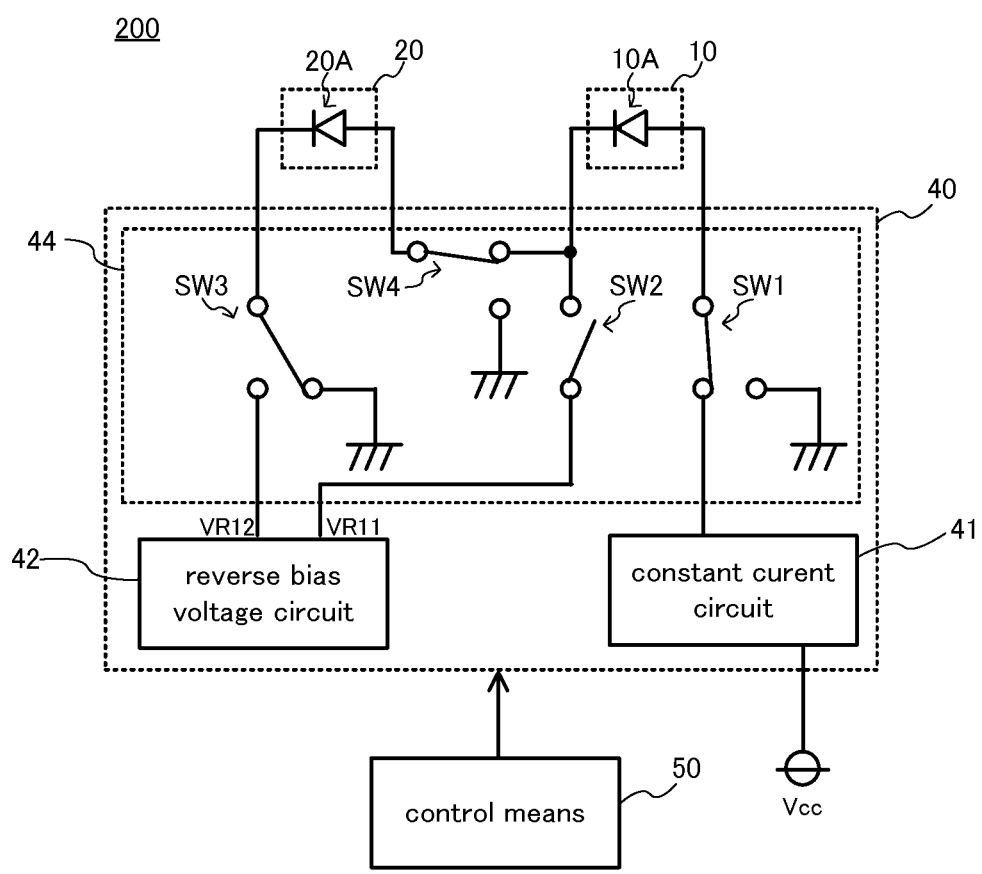
FIG. 5 is a diagram showing an electrical configuration of a lighting device according to a second embodiment of the present invention.

FIG. 5 is a diagram showing an electrical configuration of a lighting device 200 of a second embodiment of the present invention. The lighting device 200 comprises first and second organic EL panels 10 and 20 that include first and second organic EL elements 10A and 20A respectively as a light-emitting part, and a drive circuit 40 that apples an emission current or a reverse bias voltage to the first and second organic EL panels 10 and 20. The lighting device 200 further comprises a control means 50 that controls the drive circuit 40. The drive circuit 40 comprises a constant current circuit 41, a reverse bias voltage circuit 42, and a switch circuit 44.

The lighting device 200 is different from the first embodiment in a structure of the switch circuit 44.

The switch circuit 44 comprises a first switch SW1 that is connected to the first electrode 12 of the first organic EL element 10A, and connects the first electrode 12 to the constant current circuit 41 or an earth potential (0V), a second switch SW2 that switches connection and disconnection between the second electrode 14 of the first organic EL element 10A and the first electrode 22 of the second organic EL element 20A, which are connectable to each other, and a first potential VR11 (10V) of the reverse bias voltage circuit 42, and a third switch SW3 that is connected with the second electrode 24 of the second organic EL element 20A, and connects the second electrode 24 to a second potential VR12 (10V) of the reverse bias voltage circuit 42 or the earth potential (0V), and a fourth switch SW4 that connects the first electrode 22 of the second organic EL element 20A to the second electrode 14 of the first organic EL element or the earth potential. In the second embodiment, the potential of the first potential VR11 and second potential VR12 is the same potential. The switch circuit 44 switches a connection state of the first to fourth switches SW1 to SW4 according to a control signal from a control means 50.

Next, an explanation will be given to a method of driving the first and second organic EL elements 10A and 20A in the lighting device 200.

(During Emission of Light)

Figure 6:
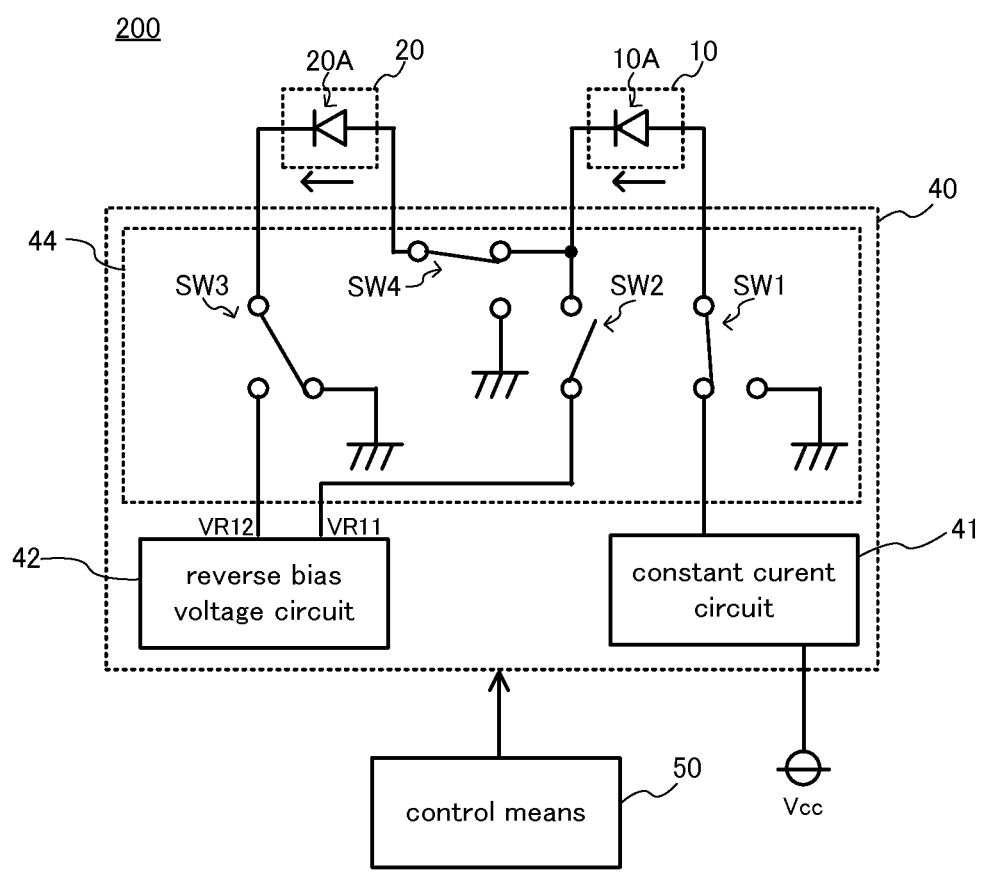
FIG. 6 is a diagram explaining a method of driving an organic EL element in the lighting device.

FIG. 6 shows a connection state of the switch circuit 44 during emission of light. During emission of light, the first switch SW1 is connected to the constant current circuit 41, the second switch SW2 is disconnected (opened), the third switch SW3 is connected to an earth potential, and the fourth switch SW 4 is connected to the second electrode 14 of the first organic EL element 10A. In such a connection, a constant current from the constant current circuit 41 is applied the first and second organic EL elements 10A and 20A in the forward direction to as indicated by an arrow in the drawing, and the first and second organic EL elements 10A and 20A emit light. At this time, the first and second organic EL elements 10A and 20A are connected in series with the constant current circuit 41, and are applied with a constant current, and the first and second organic EL elements 10A and 20A become the same brightness, and uneven brightness does not occur.

(During Application of a Reverse Bias Voltage)

Figure 7:
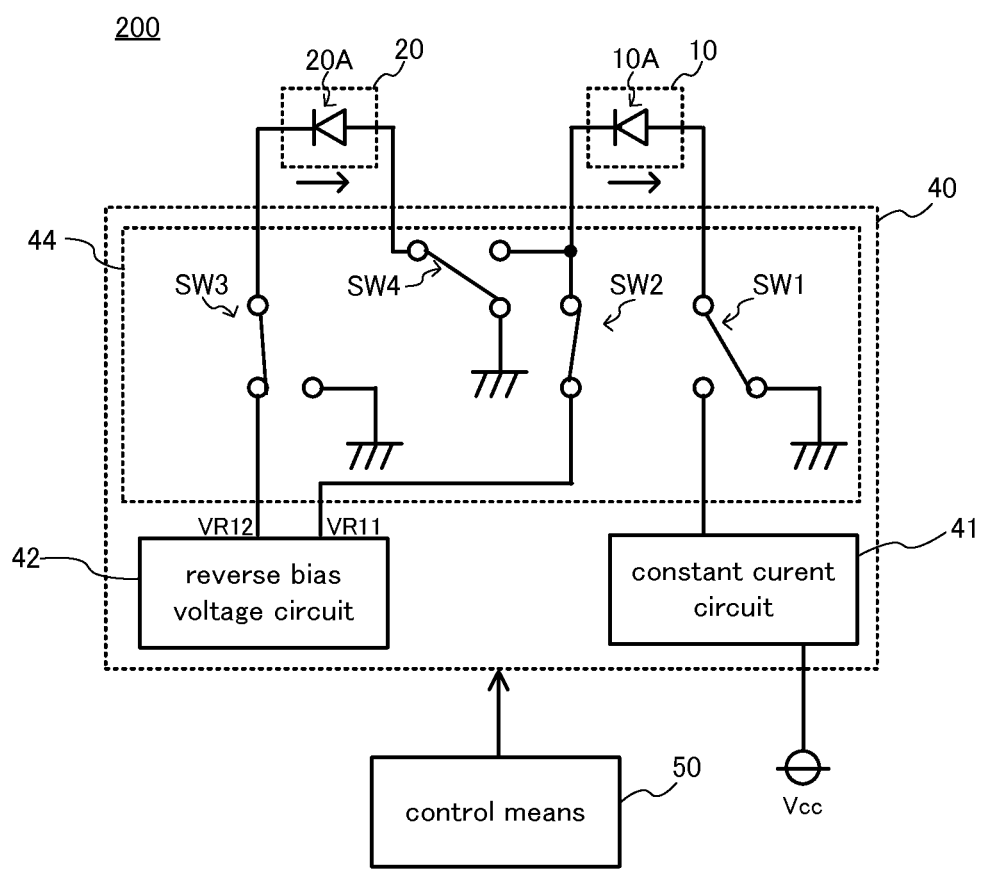
FIG. 7 is a diagram explaining a method of driving an organic EL element in the lighting device.

FIG. 7 shows a connection state of the switch circuit 44 during application of a reverse bias voltage. During application of a reverse bias voltage, the first switch SW1 is connected to an earth potential, the second switch SW is connected (shorted) to the first potential VR11 of the reverse bias voltage circuit 42 between the second electrode 14 of the first organic EL element 10A and the first electrode 22 of the second organic EL element 20A, the third switch SW 3 is connected to the second potential VR12 of the reverse bias voltage circuit 42, and the fourth switch is connected to an earth potential. In such a connection, a reverse bias voltage of −10V is applied between the first potential VR11 and the earth potential in the first organic EL element 10A, and a reverse bias voltage of −10V is also applied between the second potential VR12 and the earth potential in the second organic EL element 20A. The first and second organic EL elements 10A and 20A do not emit light.

At this time, the first and second organic EL elements 10A and 20A are connected in parallel with the reverse bias voltage circuit 42, and are applied with a reverse bias voltage. Even when a reverse bias leak develops in a defective part of one organic EL element and impedance decreases, it is possible to apply a reverse bias voltage of a value necessary for repairing to each element. Further, since a reverse bias voltage is applied to the first and second organic EL elements 10A and 20A at the same timing, the first and second organic EL elements 10A and 20A do not alternately fail to emit light with a constant time lag, and a user feels no discomfort due to a flicker. Further, in the lighting device 200, compared with the first embodiment, a voltage generated by the reverse bias voltage circuit 42 can be decreased.

As explained above, in the lighting device 200 and the method of driving the organic EL elements 10A and 20A, a constant current can be applied to the organic EL elements 10A and 20A connected in series during emission of light, and a reverse bias voltage can be applied to the organic EL elements 10A and 20A connected in parallel, thereby maintaining the light emission quality by a self-repair without degrading the light emission uniformity. Further, the number of wiring from the organic EL elements 10A and 20A is not increased, suppressing complexity of a circuit configuration.

The lighting device 200 may be provided with three or more organic EL panels. In other words, when the lighting device 200 comprises a first organic EL panel 10 to a m-th organic EL panel, each of which has a first organic EL element 10A to a m-th organic EL element, a cathode of n−1 st organic EL element is connectable with an anode of the n-th organic EL element, and the switch circuit 44 comprises a first switch SW1 that connects an anode of the first organic EL element 10 (the first electrode 12) with the constant current circuit 41 or an earth potential, a second switch SW2 that switches connection and disconnection between a cathode of the n−1 organic EL element and an anode of the n-th organic EL element and the reverse bias voltage circuit 42, and a third switch SW3 that connects a cathode of the m-th organic EL element with the reverse bias voltage circuit 42 or the earth potential, and a forth switch SW4 that connects an anode of the n-th organic EL element with a cathode of the n−1 st organic EL element or an earth potential. Here, m is a positive integer greater than 2 ($2 \leq m$), and n is a positive integer over 2 and below m ($2 \leq n \leq m$). The second switch SW2 and fourth switch SW4 are provided in m−1 pieces corresponding to the number of organic EL elements.

The switch circuit 44 connects the first switch SW1 to the constant current circuit 41, disconnects the second switch SW2, connects the third switch SW3 to the earth potential, and connects the fourth switch SW4 to a cathode of the n−1 st organic EL element during emission of light, and connects the first switch SW1 to the earth potential, connects the second switch SW2, connects the third switch SW3 to the reverse bias voltage circuit 42, and connects the fourth switch SW4 to the earth potential during application of reverse bias voltage.

Figure 8:
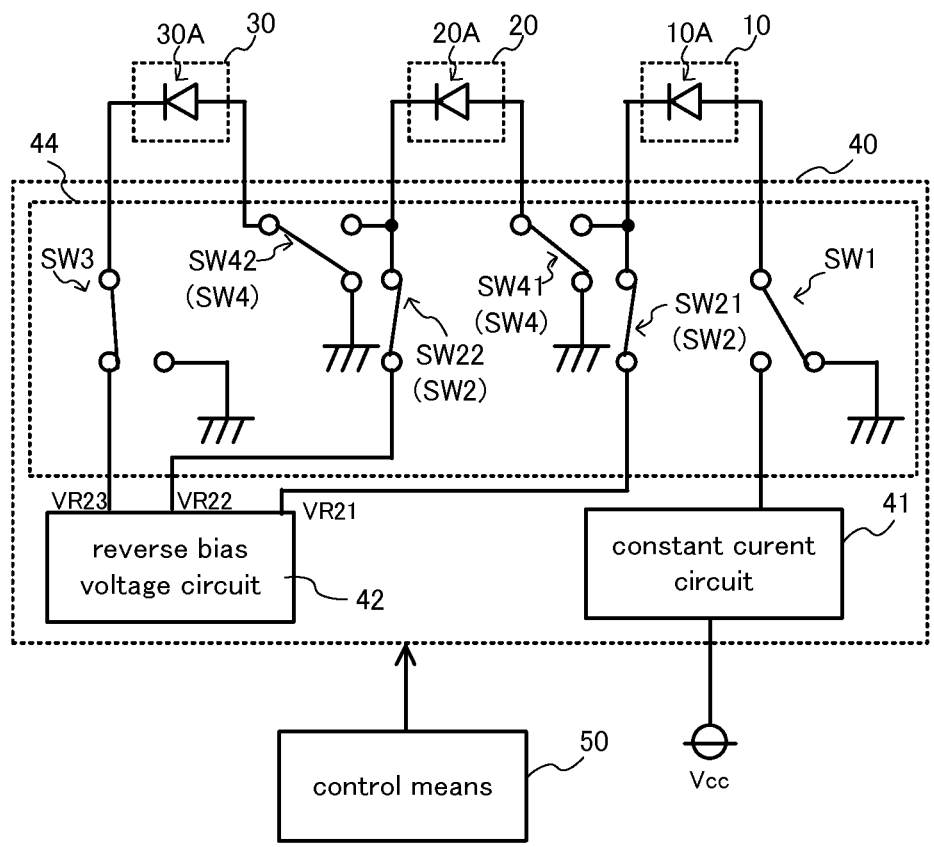
FIG. 8 is a diagram showing a modification of the lighting device.

More specifically, FIG. 8 shows an electrical configuration when the lighting device 200 comprises a first organic EL panel 10 to a third organic EL panel 30, each of which comprises a first organic EL element 10A to third organic EL element 30A, respectively (when m=3). A third organic EL element 30A and a third organic EL panel 30 shall be of the same configuration as the second organic EL element 10A and 20A and the second organic EL panels 10 and 20.

The lighting device 200 enables connection between a cathode of the first organic EL element 10A (the second electrode 14) and an anode of the second organic EL element 20A (the first electrode 22), and enables connection between a cathode of the second organic EL element 20A (the second electrode 24) and an anode of the third organic EL element 50A. The switch circuit 44 comprises a first switch SW1 that connects an anode of the first organic EL element 10A to the constant current circuit 41 or an earth potential, a switch SW21 (a second switch SW2) that switches connection and disconnection between a cathode of the first organic EL element 10A and an anode of the second organic EL element 20A, and a first potential VR21 (10V) of the reverse bias voltage circuit 42, a switch SW22 (a second switch SW2) that switches connection and disconnection between a cathode of the second organic EL element 20A and an anode of the third organic EL element 30A, and the second potential VR22 (10V) of the reverse bias voltage circuit 42, a third switch SW3 that connects a cathode of the third organic EL element 30A to a third potential VR23 (10V) of the reverse bias voltage circuit 42 or an earth potential, a switch SW41 (a fourth switch SW4) that connects an anode of the second organic EL element 20A to a cathode of the first organic EL element 10A or an earth potential, and a switch SW42 (a fourth switch SW4) that connects an anode of the third organic EL element 30A to a cathode of the second organic EL element 20A or an earth potential. Thus, each of the second switch SW2 and fourth switch SW4 are provided in two pieces corresponding to three sets of the organic EL element. The potential of the first to third potential VR21 to VR23 are the same potential.

The switch circuit 44 connects the first switch SW1 to the constant current circuit 41, disconnects each of the two switches SW21 and SW22 that are a second switch SW2, connects the third switch SW3 to the earth potential, connects two switches SW41 and 42 that are a fourth switch SW4 to cathodes of the first and second organic EL elements 10A and 20A during emission of light, and connects the first switch SW1 to the earth potential, connects two switches that are a second switch SW2, connects the third switch SW3 to the third potential VR23 of the reverse bias voltage circuit 42, and connects two switches SW41 and 42 that are a fourth switch SW4 to the earth potential during application of reverse bias voltage.

Even in such a configuration, it is possible to apply a constant current to a plurality of organic EL elements connected in series during emission of light, and to apply a reverse bias voltage to a plurality of organic EL elements connected in parallel, maintaining the emission quality by a self-repair without degrading the emission uniformity. Further, the number of wiring from the organic EL elements is not increased, suppressing complexity of a circuit configuration.

Hereinafter, examples of the invention will be explained.

EXAMPLE 1

Organic EL Panel

In the example 1, we have used an organic EL element shown in the embodiment described above. First, ITO of 300 nm thickness is formed as the first electrode 12 on the support substrate by a sputtering method, then it is patterned into a desired shape by photolithography. Next, Al of 500 nm thickness is formed as an auxiliary electrode to reduce a wiring resistance by a sputtering method, then it is patterned into a desired shape by photolithography. Next, a polyimide of 1 μm thickness is formed as an insulating film so as to partially cover the first electrode 12 and auxiliary electrode by a method of spin coating, then it is patterned into a desired shape by photolithography, and is heated at 250° C. for one hour to bake an insulating film. Next, the positive hole injection layer 13a, the positive hole transport layer 13b, the first light-emitting layer 13c, the second light-emitting layer 13d, and the electron transport layer 13e are formed in this order as the organic layer 13 on the first electrode 12 by a method of vacuum evaporation. Next, Al of 100 nm thickness is formed by a method of vacuum evaporation, thereby providing the first organic EL element 10A.

A flat plate soda glass of 0.5 mm thickness is prepared as a sealing substrate, then an ultraviolet cure adhesive containing 1 wt % of 10 μm diameter spacer is applied to the peripheral portion so as to cover the first organic EL element 10A. Thereafter, a sealing substrate and the support substrate 11 formed with the first organic EL element 10A are transported to a glove box under a nitrogen atmosphere, and both substrates are overlaid and bonded by pressing and radiating an ultraviolet ray by 10 J, thereby the first organic EL panel 10 is formed. The first organic EL panel 10 is a light-emitting panel of 48 mm×50 mm in outer dimensions and 45 mm×45 mm in a size of a pixel (a light-emitting portion).

We have made the second organic EL panel 20 having the second organic EL element 20A in the same manner as described above.

Lighting Device and a Method of Driving an Organic EL Element

The example 1 shows the lighting device 100 that uses the drive circuit 40 shown in the first embodiment. In other words, the first and second organic EL elements 10A and 20A being connected to each other through the switch circuit 43 having the first to third switches SW1 to SW3 are connected to the constant current circuit 41 and reverse bias voltage circuit 42. As a method of driving the first and second organic EL elements 10A and 20A, a constant current of 150 mA from the constant current circuit 41 is applied to the first and second organic EL elements 10A and 20A connected in series by the switch circuit 43 during emission of light, and a reverse bias voltage from the reverse bias voltage circuit 42 is applied for 5 μsec at a frequency of 100 Hz to the first and second organic EL elements 10A and 20A being connected in parallel by the switch circuit 43 during application of reverse bias voltage. At this time, the first potential VR1 of the reverse bias voltage circuit 42 is set to 10V, and the second potential VR2 is set to 20V, so that a reverse bias voltage of −10V is equally applied to the first and second organic EL elements 10A and 20A at the same timing.

EXAMPLE 2

Organic EL Panel

In the example 2, as in the example 1, we have made the first and second organic EL panels 10 and 20 having the first and second organic EL elements 10A and 20A, respectively.

Lighting Device and a Method of Driving an Organic EL Element

The example 2 shows the lighting device 200 that uses the drive circuit 40 shown in the second embodiment. In other words, the first and second organic EL elements 10A and 20A connectable via the switch circuit 44 having the first to fourth switches SW1 to SW4 are connected to the constant current circuit 41 and the reverse bias voltage circuit 42. As a method of driving the first and second organic EL elements 10A and 20A, a constant current of 150 mA from the constant current circuit 41 is applied to the first and second organic EL elements 10A and 20A connected in series by the switch circuit 44 during emission of light, and a reverse bias voltage from the reverse bias voltage circuit 42 is applied to the first and second organic EL elements 10A and 20A connected in parallel at a frequency of 100 Hz for 5 μsec by the switch circuit 44 during application of reverse bias voltage. At this time, the first and second potentials VR1 and VR2 of the reverse bias voltage circuit 42 are set to 10V, so that a reverse bias voltage of −10V is equally applied to the first and second organic EL elements 10A and 20A at the same timing.

Comparative Example

Organic EL Panel

In the comparative example, we have made the first and second organic EL panels 10 and 20 having the first and second organic EL elements 10A and 20A, respectively, as in the embodiment 1.

Lighting Device and a Method of Driving an Organic EL Element

In the comparative example, connection of the first and second organic EL elements 10A and 20A can be switched to a series connection with a constant current circuit and a series connection with a reverse bias voltage circuit. A constant current of 150 mA from a constant current circuit is applied to the first and second organic EL elements 10A and 20A connected in series during emission of light, and a reverse bias voltage from a reverse bias voltage circuit is applied to the first and second organic EL elements 10A and 20A connected in series at a frequency of 100 Hz for 5 μsec during application of reverse bias voltage. At this time, a potential of the reverse bias voltage circuit is set to 20V, so that the voltage is divided by −10V to the first and second organic EL elements 10A and 20A.

(Evaluation Method)

As a method of evaluating the comparative example and the examples 1 and 2, we have performed a high temperature energization test for 1,000 hours by driving and emitting light at a luminance of 3,000 cd/cm$^2$ under a temperature environment of 80° C. Such a test is mainly used as a life accelerated aging test of an organic EL element. At the same time, such a test has a high probability of causing a short circuit, and can be used also for evaluating repairability by application of revere voltage. The following table 1 shows the short circuit occurrence rate as a result of the test.

TABLE 1

| | Input number | Leak increase rate (%) (Average of all panels) | Number of panels with a short circuit | Occurrence rate | Judgment |
|---|---|---|---|---|---|
| Comparative example | n = 5 | 1500% | 3 | 30.0% | x |
| Example 1 | n = 5 | 94% | 0 | 0 | ○ |
| Example 2 | n = 5 | 95% | 0 | 0 | ○ |

According to the test results, it is confirmed that a short circuit occurs and a leak current value increases in the comparative example, and a short circuit does not occur and an effect of decreasing a leak current value is confirmed in the examples 1 and 2. Therefore, it is apparent that the present invention provides a high reparability, and is effective in suppressing a short circuit.

The above description exemplifies the present invention. It is thus possible to change and modify the invention in various forms without departing from its spirit or essential characteristics. In the embodiments, the lighting devices 100 and 200 are taken as an example of a light emitting device. A light emitting device may be a display device.

INDUSTRIAL APPLICABILITY

The present invention is suitable for a light emitting device using an organic EL element.

DESCRIPTION OF REFERENCE NUMERALS 100, 200 Lighting device
10 First organic EL panel
10A First organic EL element
20 Second organic EL panel
20A Second organic EL element
30 Third organic EL panel
30A Third organic EL element 40 Drive circuit
41 Constant current circuit
42 Reverse bias voltage circuit
43, 44 Switch circuit
50 Control means

The invention claimed is:

1. A light emitting device comprising:
a plurality of organic EL elements each of which is supplied with a current, and emits light;
a constant current circuit that supplies a current to each of the organic EL elements; a reverse bias voltage circuit that applies a reverse bias voltage to each of the organic EL elements, and a switch circuit that connects the plurality of organic EL elements in series with the constant current circuit during emission of light, and connects the plurality of organic EL elements in parallel with the reverse bias voltage circuit during application of reverse bias voltage, wherein
first and second organic EL elements are provided and a cathode of the first organic EL element is connected with an anode of the second organic EL element,
the switch circuit comprise a first switch that connects an anode of the first organic EL element to the constant current circuit or an earth potential a second switch that switches connection and disconnection between a cathode of the first organic EL element and an anode of the second organic EL element, and a first potential of the reverse bias voltage circuit, and a third switch that connects a cathode of the second organic EL element to a second potential higher than the first potential of the reverse bias voltage circuit or the earth potential,
the switch circuit connects the first switch to the constant current circuit disconnects the second switch and connects the third switch to the earth potential during emission of light, and
the switch circuit connects the first switch to the earth potential connects the second switch, and connects the third switch to the second potential during application of reverse bias volt.

2. The light emitting device according to claim 1, wherein a reverse bias voltage is applied to each of the organic EL elements at the same timing.

3. A light emitting device comprising;
a plurality of organic EL elements each of which is supplied with a current, and emits light:
a constant current circuit that supplies a current to each of the organic EL elements:
a reverse bias voltage circuit to each of the organic EL elements; and
a switch circuit that connects the plurality of organic EL elements in series with the constant current circuit during emission of light, and connects the plurality of organic EL elements in parallel with the reverse bias voltage circuit during application of reverse bias voltage,
wherein first to m-th organic EL elements are provided, and a cathode of n−1st organic EL element is connectable with an anode of n-th organic EL element, the switch circuit comprises a first switch that connects an anode of the first organic EL element to the constant current circuit or an earth potential, a second switch that switches connection and disconnection between a cathode of the n−1st organic EL element and an anode of the n-th organic EL element, and the reverse bias voltage circuit, and a third switch that connects a cathode of the m-th organic EL element to the reverse bias voltage circuit or the earth potential, and a fourth switch that connects an anode of the n-th organic EL element to a cathode of the n−1st organic EL element or the earth potential,
the switch circuit connects the first switch to the constant current circuit, disconnects the second switch, connects the third switch to the earth potential, and connects the fourth switch to a cathode of the n−1st organic EL element during emission of light, and the switch circuit connects the first switch to the earth potential, connects the second switch, connects the third switch to the reverse bias voltage circuit, and connects the fourth switch to the earth potential during application of reverse bias voltage.

* * * * *